United States Patent

Schwarz et al.

(10) Patent No.: US 10,496,778 B2
(45) Date of Patent: Dec. 3, 2019

(54) METHOD FOR INCREASING THE DECOUPLING CAPACITY IN A MICROELECTRONIC CIRCUIT

(71) Applicant: TDK—Micronas GmbH, Freiburg (DE)

(72) Inventors: Nathalie Schwarz, Horbourg (FR); Jens Mayer, Munich (DE)

(73) Assignee: TDK—Micronas GmbH, Freiburg (DE)

(*) Notice: Subject to any disclaimer, the term of this patent is extended or adjusted under 35 U.S.C. 154(b) by 133 days.

(21) Appl. No.: 15/627,795

(22) Filed: Jun. 20, 2017

(65) Prior Publication Data

US 2017/0364625 A1  Dec. 21, 2017

(30) Foreign Application Priority Data

Jun. 21, 2016 (DE) .......... 10 2016 111 337

(51) Int. Cl.
- G06F 17/50 (2006.01)
- H01L 23/64 (2006.01)
- H01L 27/02 (2006.01)
- H05K 3/00 (2006.01)

(52) U.S. Cl.
CPC ...... *G06F 17/5072* (2013.01); *G06F 17/5077* (2013.01); *G06F 17/5081* (2013.01); *H01L 23/64* (2013.01); *H01L 27/0207* (2013.01); *H05K 3/0005* (2013.01); *G06F 17/5068* (2013.01)

(58) Field of Classification Search
None
See application file for complete search history.

(56) References Cited

U.S. PATENT DOCUMENTS

| | | | |
|---|---|---|---|
| 6,618,843 B2 | 9/2003 | Dansky et al. | |
| 6,618,847 B1 | 9/2003 | Hulse et al. | |
| 6,898,769 B2 | 5/2005 | Nassif et al. | |
| 7,033,883 B2 | 4/2006 | Huang et al. | |
| 7,222,320 B2* | 5/2007 | Ogawa | G06F 17/5072 257/E23.079 |
| 7,565,638 B2* | 7/2009 | Hoerold | G06F 17/5068 716/106 |
| 7,685,550 B2* | 3/2010 | Siegler | G06F 17/5068 716/119 |
| 7,698,677 B2* | 4/2010 | Zhao | G06F 17/5077 716/122 |
| 7,709,301 B2 | 5/2010 | Bosshard | |

(Continued)

FOREIGN PATENT DOCUMENTS

DE  10339283  3/2009

OTHER PUBLICATIONS

P. Zhou et al., "Optimizing Decoupling Capacitors in 3D Circuits for Power Grid Integrity," 2009 IEEE Design & Test of Computers, pp. 15-25. (Year: 2009).*

(Continued)

*Primary Examiner* — Leigh M Garbowski
(74) *Attorney, Agent, or Firm* — 24IP Law Group USA, PLLC; Timothy Dewitt (57) ABSTRACT

A method for increasing the decoupling capacitance in a microelectronic circuit. The method comprises producing a circuit design of the microelectronic circuit, analyzing the produced circuit design, and subsequently filling gaps in the circuit design by cells with decoupling capacitor.

9 Claims, 5 Drawing Sheets

(56) References Cited

U.S. PATENT DOCUMENTS

| | | | |
|---|---|---|---|
| 7,786,513 B2 * | 8/2010 | Tsutsumi | H01L 27/118 257/203 |
| 8,134,824 B2 | 3/2012 | Frederick et al. | |
| 8,261,224 B2 * | 9/2012 | Malgioglio | G06F 17/505 716/118 |
| 8,946,856 B2 | 2/2015 | Pereira et al. | |
| 2002/0040463 A1 | 4/2002 | Dansky et al. | |
| 2004/0073881 A1 | 4/2004 | Nassif et al. | |
| 2014/0282340 A1 | 9/2014 | Sundareswaran et al. | |

OTHER PUBLICATIONS

M. Cauwe et al., "Embedded passive components for improved power plane decoupling," 2014 IEEE, 4 pages. (Year: 2014).*

J. Lee et al., "Analysis of On Chip Decoupling Capacitor in the Double-Gate FinFETs with PEEC-based Power Delivery Network," ISOCC2014, 2014 IEEE, pp. 290-291. (Year: 2014).*

J. Held et al., "Optimized Decoupling Concepts for Digital VLSI Circuits," 2001 IEEE, pp. 904-909. (Year: 2001).*

E. Wong et al., "Power Supply Noise-aware 3D Floorplanning for System-On-Package," 2005 IEEE, pp. 259-262. (Year: 2005).*

L. Kang et al., "Simultaneous Switching Noise Consideration for Power/Ground Network Optimization," 2007 IEEE, pp. 332-337. (Year: 2007).*

C.-Y. Yeh et al., "Timing-Aware Power-Noise Reduction in Placement," IEEE Trans. on Computer-Aided Design of Integrated Circuits and Systems, vol. 26, No. 3, Mar. 2007, pp. 527-541. (Year: 2007).*

K. Shimazaki et al., "A Minimum Decap Allocation Technique Based on Simultaneous Switching for nanoscale SoC," IEEE 2009 Custom Integrated Circuits Conference (CICC), pp. 21-24. (Year: 2009).*

Wikipedia, "Layout Versus Schematic," Version Jan. 6, 2016.

Wikipedia, "Design rule checking," Version Aug. 3, 2016.

* cited by examiner

METHOD FOR INCREASING THE DECOUPLING CAPACITY IN A MICROELECTRONIC CIRCUIT

CROSS-REFERENCE TO RELATED APPLICATIONS

This application claims benefit of and priority to German Patent Application DE 10 2016 111 337, filed on 21 Jun. 2016. The entire disclosure of German Patent Application DE 10 2016 111 337, is hereby incorporated by reference.

FIELD OF THE INVENTION

The invention relates to a method for increasing the decoupling capacity in a microelectronic circuit and a system and a computer program product for carrying out the method.

BACKGROUND OF THE INVENTION

Microelectronic circuits are very complex, highly integrated circuits and are designed today with the aid of electronic design automation (EDA) software. The EDA software offers support in the production of circuit designs, for example in the semi-automated development of integrated circuits and the production of a layout (mask data) for a semiconductor chip. A designer specifies the microelectronic circuit in the EDA software. The EDA software subsequently converts the specification into a circuit diagram and creates the layout for the microelectronic circuit.

In view of the increasing integration of microelectronic circuits, the integrity of the signals in the microelectronic circuit becomes an important factor. The integrity of the signals depends among other things on the electric signal-to-noise ratio due to electrical noise in the microelectronic circuit. One of the disturbance sources for the electrical noise is variations in the supply line voltages due to the switching of elements in the microelectronic circuit. The magnitude of this electric noise depends on the number of simultaneously switched elements in the electronic circuit, their size, capacities and positions on the semiconductor chip and the packing density of the elements on the chip.

In order to reduce this electrical noise, so-called decoupling capacitors are incorporated into the microelectronic circuit on the chip. These decoupling capacitors are preferably positioned in the vicinity of the disturbance sources, for example switching elements. The decoupling capacitors dampen the high-frequency electric noise in the supply lines. It is known that the most effective position for the decoupling capacitors is below the switching elements or the supply lines.

Various solutions for positioning the decoupling capacitors are known from the state of the art. For example, the U.S. Pat. No. 7,033,883 (Faraday Technology Corp.) discloses a method for positioning the decoupling capacitors in an integrated circuit by detecting free space on a chip. The decoupling capacitors are integrated in the free spaces.

The U.S. Pat. No. 7,709,301 (Texas Instruments) also teaches a microelectronic circuit with decoupling capacitors. This patent teaches the production of two adjacent decoupling capacitors with an electric layer between the two decoupling capacitors.

The U.S. Pat. No. 6,898,769 (IBM) teaches a method and a system for optimizing the position and the size of decoupling capacitors on a semiconductor chip. Logical cells are positioned in a first layout of the microelectronic circuit and the decoupling capacitors are inserted in the empty space between neighboring cells.

The U.S. Pat. No. 6,618,843 discloses a method for analyzing decoupling capacities in a microelectronic circuit. This method includes, among other things, an analysis of the number of decoupling capacitors and their spacing from the switching elements in the microelectronic circuit. The method also takes account of the orientation and the size of the individual switching elements.

The U.S. Patent Application Publication No. 2014/0282340 (Freescale) discloses a method for positioning the decoupling capacitors in a microelectronic circuit, which firstly includes an analysis of the circuit design without the decoupling capacitors with a simulation of variations in the microelectronic circuit. On the basis of this analysis the demand for decoupling capacity is ascertained which is taken into account for observing the specifications for the supply line. A decoupling capacitor for these specifications is then determined and incorporated into the circuit.

The German Patent No. DE 103 39 283 B9 describes a method for designing re-design capable integrated circuits in which fill cells represent replacement logic devices. It is possible to correct logic malfunctions of the integrated circuit caused by an error in the design, for example by incomplete verification, with the aid of a modified wiring. The re-design capability is achieved by filling the area of the filling cells in the place and route design step with additional semiconductor components. These represent spare logic gates, which are used, if necessary, during a re-design, in order to correct malfunctions of the logic modules assigned to the logic cells. The necessary iteration cycle for logic correction is therefore limited to the BEOL (Back End Of Line) section of the manufacturing process.

The U.S. Pat. No. 6,618,847 B1 (STMicroelectronics, Inc.) describes the optimization of the electrical properties of an integrated circuit (IC) by modifying the physical layout of the IC. Specifically, U.S. Pat. No. 6,618,847 B1 determines when portions or regions of the IC relating to different standard cells are under-utilized in the IC design. U.S. Pat. No. 6,618,847 B1 includes appropriate electrical components in such underused areas to increase electrical power, such as stabilizing the energy delivered to various logic areas of the IC, such as macros. U.S. Pat. No. 6,618,847 B1 describes that capacitors are inserted into the filling cells 25, thereby producing gate capacitors in the spaces 40.

There is a need to increase the decoupling capacitance of a microelectronic circuit.

SUMMARY OF THE INVENTION

In a preferred embodiment the present invention is a method reproducing a layout of the microelectronic circuit and an analysis of the produced circuit design to determine gaps in the layout. The gaps in the layout are filled up by cells with decoupling capacitor. The method enables cells with decoupling capacitors to be introduced in any part of the chip on which the microelectronic circuit is manufactured. There are no preferred areas in which the decoupling capacitors are to be placed.

In order to avoid problem cases, for example caused by short circuits, the positions of conductor paths around the cells with decoupling capacitor are analyzed and the conductor paths are rearranged when problem cases occur.

The method further includes the replacement of at least one of the cells with the decoupling capacitor by at least one cell with a supply line when otherwise irresolvable problem cases occur.

In a further aspect of the method the gaps are divided into a plurality of sections and each section is analyzed separately in order to recognize problem cases in the respective sections. When such problem cases occur in individual ones of the sections, the conductor paths are rearranged or at least one of the cells with decoupling capacitor is replaced by at least one cell with supply line.

A system with a server for carrying out the method and a computer program product for carrying out the method is also described.

BRIEF DESCRIPTION OF THE DRAWINGS

The invention will now be explained in more detail with reference to the following figures. It will be understood that the embodiments and aspects of the invention described in the figures are only examples and do not limit the protective scope of the claims in any way. The invention is defined by the claims and their equivalents. It will be understood that features of one aspect or embodiment of the invention can be combined with a feature of a different aspect or aspects of other embodiments of the invention. This invention becomes more obvious when reading the following detailed descriptions of some examples as part of the disclosure under consideration of the enclosed drawings. Referring now to the attached drawings which form a part of this disclosure.

DETAILED DESCRIPTION

The object of the present invention is fully described below using examples for the purpose of disclosure, without limiting the disclosure to the examples. The examples present different aspects of the present invention. To implement the present technical teaching, it is not required to implement all of these aspects combined. Rather, a person skilled in the art will select and combine those aspects that appear sensible and required for the corresponding application and implementation.

Figure 1:
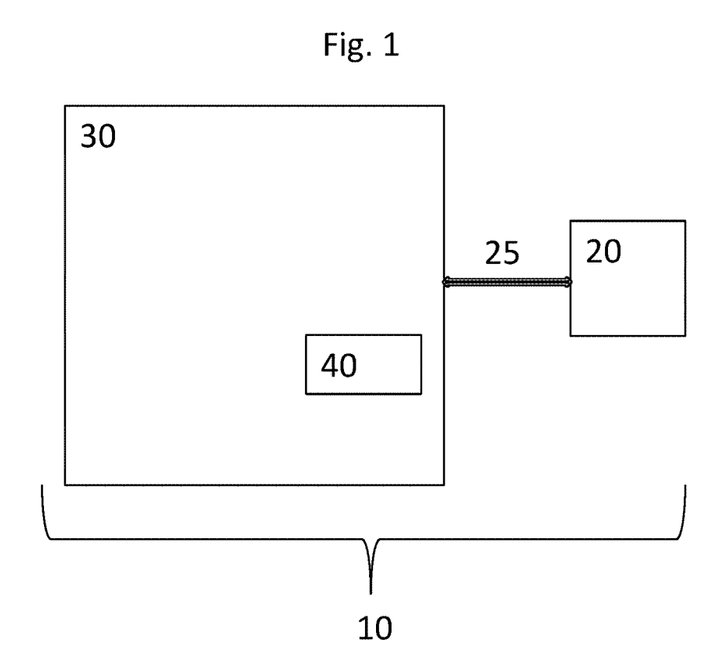
FIG. 1 is an overview of a system for producing circuit designs and layouts for a microelectronic circuit.

FIG. 1 shows an overview of an exemplary system 10 for producing a circuit design and a layout 100 on the basis of the circuit design for a microelectronic circuit. The system 10 comprises a work station 20 connected to a server 30 via a network 25. An EDA software 40 runs on the server 30. The EDA software 40 can be from Synopsys, Cadence or Mentor, for example. A designer at the work station 20 uses the EDA software 40 for specifying a circuit design for the microelectronic circuit. The EDA software 40 checks the circuit design and creates the layout 100 automatically. The designer can view the circuit design and the layout 100 at the work station 20 and create changes in the circuit design or layout 100.

Figure 2:
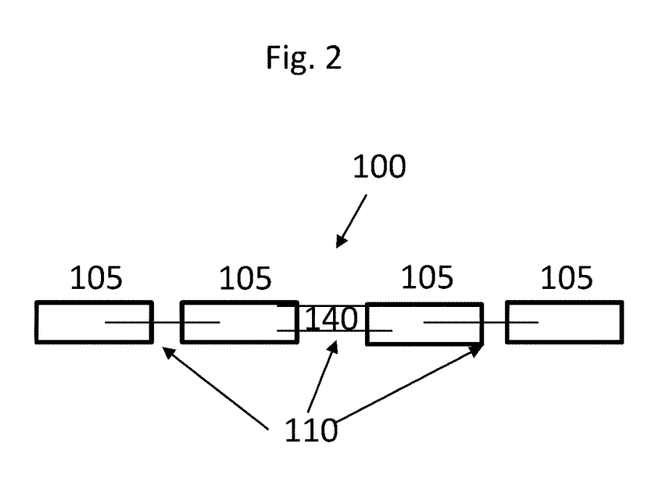
FIG. 2 illustrates a layout of elements in the microelectronic circuit.

FIG. 2 shows a part of a typical layout 100 of the microelectronic circuit. This layout 100 comprises a plurality of cells 105 which comprise a plurality of elements, for example switching elements. The cells 105 are arranged in rows. In FIG. 2 merely one single row is represented. In practice, the layout 100 comprises a very large number of cells in a large number of rows. Between the cells 105 there are gaps 110. In FIG. 2 all cells 105 are shown to be of equal size. In practice, these cells 105 can be of different sizes.

Between the cells 105 conductor paths 140 are arranged. These conductor paths 140 connect the elements in the cells 105. FIG. 2 shows only one level of the layout 100. The finished microelectronic circuit comprises a multiplicity of levels with cells 105 and conductor paths 140. Between the levels "vias" or connections or through-connections are present which connect the conductor paths 140 on the individual levels (metal layers) electrically/physically.

Figure 3:
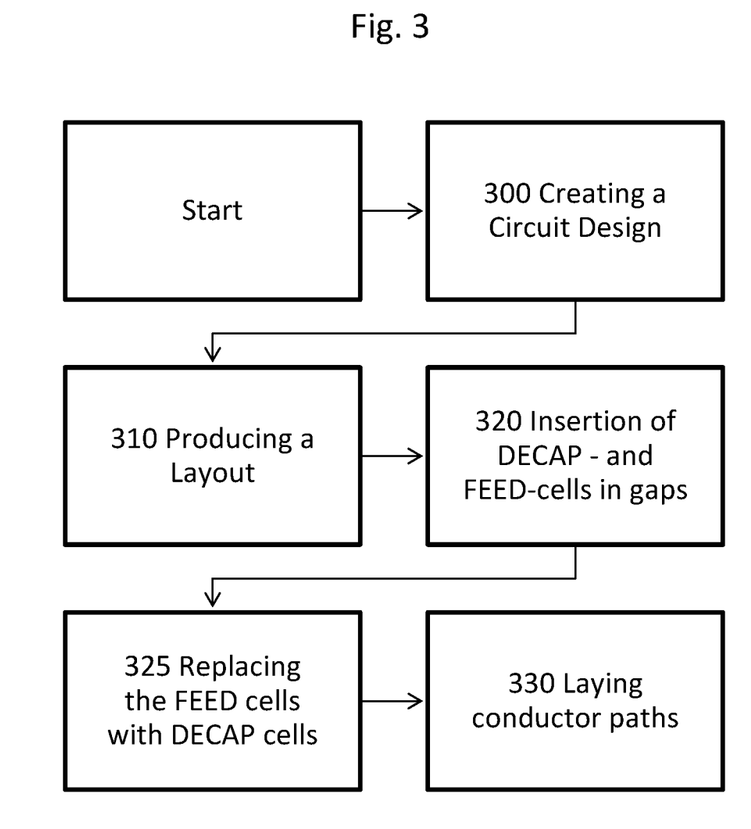
FIG. 3 illustrates a sequence of a method in accordance with a preferred embodiment of the present invention.

The method for producing a layout 100 for the microelectronic circuit is shown in FIG. 3. In a first step 300 the circuit design is produced by the designer. This circuit design is produced by the EDA software 40. After the production of the circuit design, the EDA software 40 automatically creates the layout 100 for a semiconductor chip of the microelectronic circuit in step 310. The EDA software 40 produces the layout 100 by positioning the cells 105 and the corresponding conductor paths 140 on a plurality of levels. In the gaps 110 between the cells 105 so-called FILLER cells are integrated in the step 320. These FILLER cells contain either decoupling capacitors (so-called DECAP cells standing for decoupling capacitors) or empty cells that only have a supply line (called FEED cells).

In the non-limiting embodiment of this method the decoupling capacitors in the DECAP cells merely have M1 structures, wherein a M1 structure is a metallization layer above the cell 105, and form a small capacitor between the supply line and the neutral wire. In this embodiment example the decoupling capacitors are placed merely in the gaps 110 by the EDA software 40, where no M1 layer of the decoupling capacitor touches the conductor paths 140 of the produced layout 100. In the other gaps 110 FEED cells are integrated. In the microelectronic circuits so far, this automatic placing of the DECAP cells leads to a low value for the decoupling capacity of the microelectronic circuit. Tests have shown that less than five percent of the FILLER cells contain decoupling capacitors.

In a further step 325 the FEED cells are replaced by DECAP cells with decoupling capacitors in the layout 100, as long as the replacement has only a minor influence on the existing conductor paths 140 or time specifications of the microelectronic circuit. This step 325 is created by a script in the EDA software 40. In this step 325 largely only those FEED cells are replaced by DECAP cells in which only few conductor paths 140 are present above the cells, otherwise a negative influence would have to be expected. This replacement of the cells can cause a short circuit between the conductor paths 140 in the M1 layer, however, and for this reason in a further step 330 a further run of the EDA software 40 is effected, in order to newly place the conductor paths 140 in the M1 metallization layer above the replaced cell or to lay them in higher levels, in order to eliminate such short circuits. This repositioning of the conductor paths 140 is possible only when the number of conductor paths 140 above the replaced cells does not have a high density of the conductor paths 140. Otherwise, this further run of the EDA software 40 cannot replace the conductor paths 140 optimally. In principle, a repositioning of the conductor paths 140 is possible independently of the density of the conductor paths, the density of the conductor paths is merely analyzed here in order not to have the EDA software 40 effect excessive changes of the existing conductor paths 140; this could change a timing of the circuit, for example.

Figure 4A:
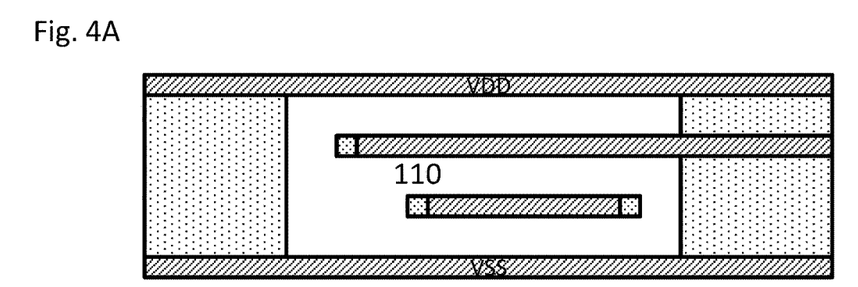
FIGS. 4A-4C illustrate the replacement of cells.
Figure 4B:
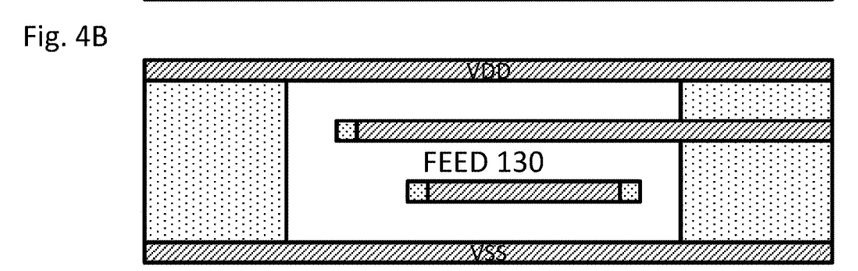
Figure 4C:
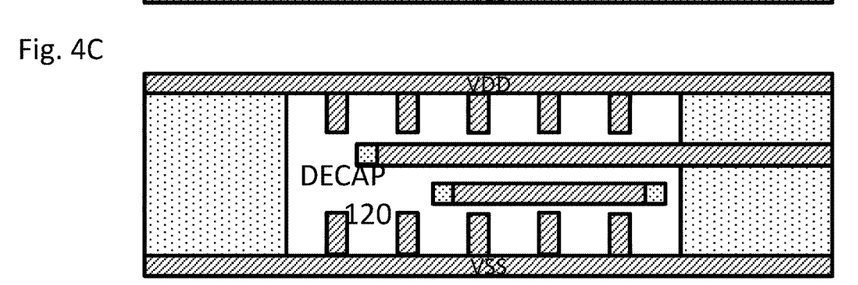

FIGS. 4A-C show an example of this step. In FIG. 4a a gap 110 between two cells is represented. In FIG. 4B this gap is filled by the EDA software 40 with FEED cells 130. In FIG. 4C the FEED cells 130 are replaced by DECAP cells 120 with decoupling capacitors and the conductor paths 140 are newly replaced or rearranged or positioned in order to avoid a short circuit.

After carrying out the step 330, the microelectronic circuit has a substantially higher number of decoupling capacitors. However, the layout 100 can still have too few decoupling capacitors. Unlike the prior art method known from U.S. Pat. No. 6,618,847 B1, the decoupling capacitors can be inserted throughout the microelectronic circuit.

In a further embodiment of the method the step 325 can be complemented. In this further aspect, the respective cells 105 are divided into a plurality of sections.

In FIGS. 5A-D it can be seen that the cells 105 are divided into three sections in each case, and the replacement of FEED cells by DECAP cells is performed for each of the three sections in each case. In this exemplary method step, three sections are taken into account. Of course, a larger or smaller number of sections can be taken into account.

Figure 5A:
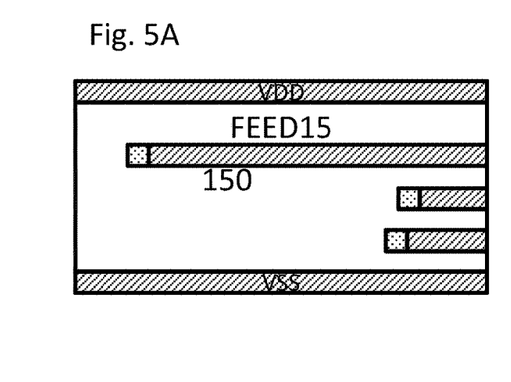
FIGS. 5A-5D illustrate the division of the cells into sections.
Figure 5B:
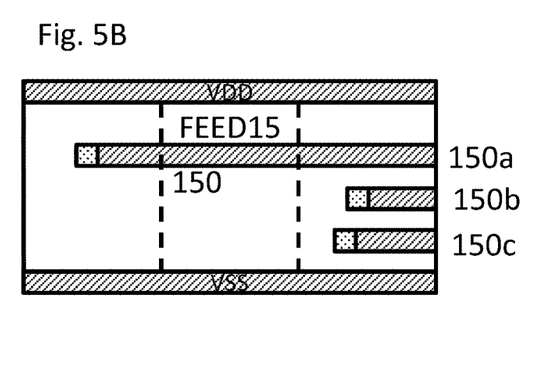
Figure 5C:
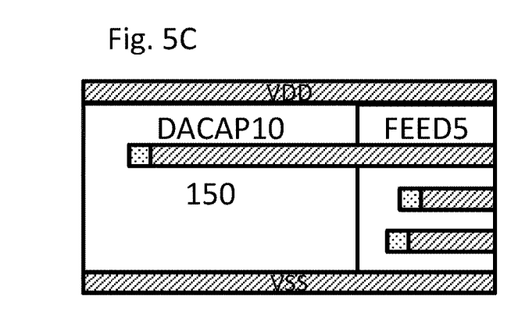

It can be seen in FIG. 5A that the replacement of the FEED15 cells is not possible since the density of the conductor paths 150 and 150a-c is too high. In FIG. 5B the cell is divided into three sections and it can be recognized that the problem is present merely in the right section with the three conductor paths 150a-c. In the left and central section the partial FEED15 cell can be replaced by a DECAP10 cell with a corresponding decoupling capacitor. Thus, the cell in FIG. 5C is formed with a decoupling capacitor in the left section and empty FEED5 cells on the right side.

Figure 5D:
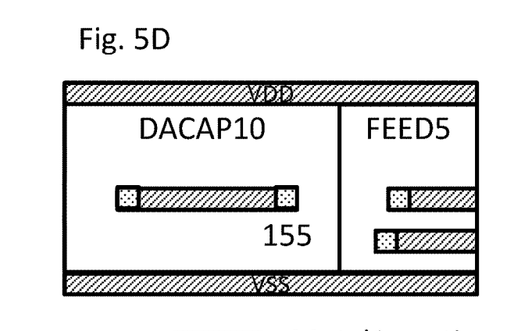

After carrying out the method step 330, the conductor path 150 will be rearranged and brought to an upper level by vias 155. This rearrangement is shown in FIG. 5D.

Figure 6:
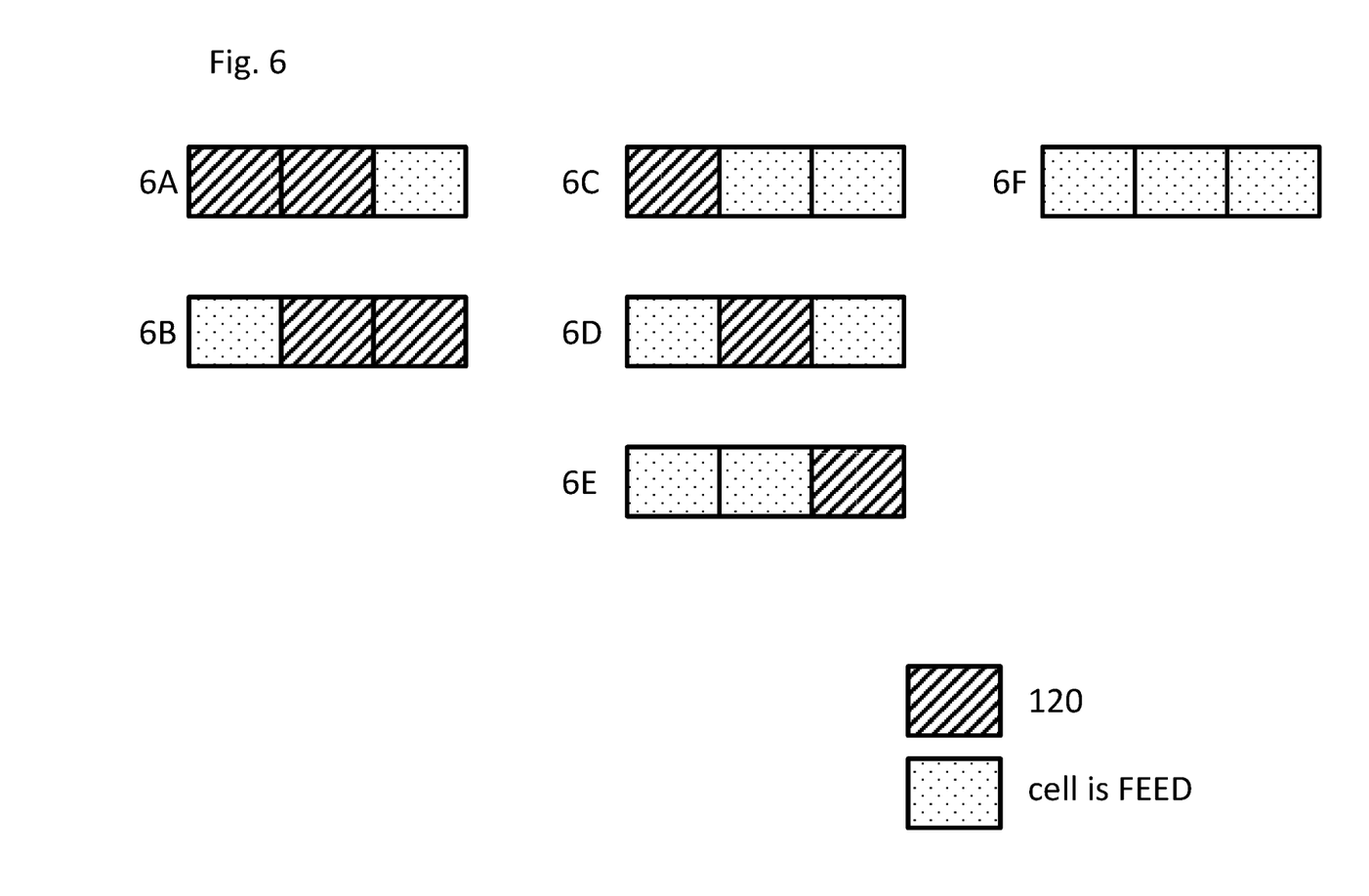
FIGS. 6A-6F illustrate different elements in different sections.

In FIG. 6 the different possibilities are shown for the cells represented in FIG. 5A-5D. It can be seen that each cell 105 has been/is divided into three sections and the respective sections are analyzed. The decoupling capacitor can be integrated either in the left and central section (FIG. 6A), in the right and central section (FIG. 6B) or only in the left section (FIG. 6C), in the central section (FIG. 6D) or in the right section (FIG. 6E). It would also be possible that none of the three sections can accommodate a decoupling capacitor 120 and in this case the cell 105 is not divided into sections (FIG. 6F).

In a further aspect of the method merely DECAP cells with decoupling capacitors 120 are integrated in the gaps 110 in the step 320. These "forcefully integrated" cells cause many short circuits in the microelectronic circuit. In this case, some of the problematic conductor paths 140 causing these short circuits are rearranged in a further run of the EDA software 140. However, the EDA software does not attempt to rearrange all problematic conductor paths 140 where short circuits occur.

A further run of the EDA software 40 subsequently removes all FEED cells where short circuits possibly still occur after rearrangement of the conductor paths 140. This further aspect of the method has the result that the microelectronic circuit has additional DECAP cells with decoupling capacitors.

In several tests, rules were determined for carrying out the method step. It was determined that the highest number of conductor paths for the analysis of the short circuits amounts to four or five levels. When a conductor path 140 is disposed above the cell 105 on the fifth level, it is assumed that this conductor path cannot cause any short circuits. The conductor paths 140 outside of the cells are not taken into account, since these hardly contribute to short circuits.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

LIST OF REFERENCE NUMBERS

10 system
20 work station
25 network
30 server
40 EDA software
100 layout
105 cell
110 gap
120 DECAP cell with decoupling capacitor
130 FEED cell with supply voltage
140 conductive path
150 conductive path
155 via

What is claimed is:

1. A computer-implemented method for increasing the decoupling capacity in a microelectronic circuit comprising:
   producing with a computer a circuit design of a microelectronic circuit, wherein the microelectronic circuit comprises a plurality of cells, a plurality of gaps between ones of the plurality of cells, and a plurality of conductor paths between the cells, and wherein said producing the circuit design further comprises integrating into the plurality of gaps empty ones of the plurality of cells (FEED cells) and decoupling ones of the plurality of cells with decoupling capacitor (DECAP) cells;
   analyzing with said computer the produced circuit design to detect problem cases;
   replacing ones of the empty ones of the plurality of cells (FEED cells) in the circuit design with the decoupling ones of the plurality of cells in dependency of the number of the conductor paths arranged above the empty ones of the plurality of cells (FEED cells); and
   rearranging using said computer one or more of the conductor paths on detection of occurrence of a problem case.

2. The computer-implemented method according to claim 1, further comprising:
   replacing with said computer at least one of the cells with the decoupling capacitor by at least one cell with a supply line when problem cases occur that are irresolvable otherwise.

3. The method according to claim 1, further comprising:
dividing the gaps into several sections with said computer; and
separately analyzing with said computer the positions of the conductor paths around the respective sections, in order to recognize problem cases.

4. The method according to claim 3, further comprising, upon occurrence of problem cases in individual ones of the sections, rearranging with said computer the conductor paths or replacement of at least one of the cells with a decoupling capacitor by at least one cell with a supply line.

5. The method according to according to claim 4, further comprising the positioning with said computer at least one of the cells with a decoupling capacitor in the circuit design.

6. The method according to claim 5, further comprising rearranging with said computer conductor paths around the at least one cell with decoupling capacitor in order to remove at least a part of the problem cases.

7. The method according to claim 6, further comprising replacing with said computer at least one of the cells with decoupling capacitor by at least one cell with supply voltage when irresolvable problems occur.

8. A system with a server for carrying out the method for increasing the decoupling capacity in a microelectronic circuit, the method comprising:
producing with said server a circuit design of the microelectronic circuit, wherein the microelectronic circuit comprises a plurality of cells, a plurality of gaps between ones of the plurality of cells, and a plurality of conductor paths between the cells, and wherein said producing the circuit design further comprises integrating into the plurality of gaps empty ones of the plurality of cells (FEED cells) and decoupling ones of the plurality of cells with decoupling capacitor (DECAP) cells;
analyzing with said server the produced circuit design to detect problem cases;
replacing ones of the empty ones of the plurality of cells (FEED cells) in the circuit design with the decoupling ones of the plurality of cells in dependency of the number of the conductor paths arranged above the empty ones of the plurality of cells (FEED cells); and
rearranging using said computer one or more of the conductor paths on detection of occurrence of a problem case.

9. A computer program product comprising program logic for carrying out a method for increasing the decoupling capacity in a microelectronic circuit, the method comprising:
producing with said server a circuit design of the microelectronic circuit, wherein the microelectronic circuit comprises a plurality of cells, a plurality of gaps between ones of the plurality of cells, and a plurality of conductor paths between the cells, and wherein said producing the circuit design further comprises integrating into the plurality of gaps empty ones of the plurality of cells (FEED cells) and decoupling ones of the plurality of cells with decoupling capacitor (DECAP) cells;
analyzing the produced circuit design to detect problem cases;
replacing ones of the empty ones of the plurality of cells (FEED cells) in the circuit design with the decoupling ones of the plurality of cells in dependency of the number of the conductor paths arranged above the empty ones of the plurality of cells (FEED cells); and
rearranging using said computer one or more of the conductor paths on detection of occurrence of a problem case,
wherein the program logic is stored in a memory.

* * * * *